(12) United States Patent
Ledoux et al.

(10) Patent No.: US 10,876,826 B2
(45) Date of Patent: Dec. 29, 2020

(54) SYSTEM FOR DETERMINING THE THICKNESS OF A RUBBER LAYER OF A TIRE

(71) Applicants: COMPAGNIE GENERALE DES ETABLISSEMENTS MICHELIN, Clermont-Ferrand (FR); Michelin Recherche et Technique S.A., Granges-Paccot (CH)

(72) Inventors: Thomas Ledoux, Clermont-Ferrand (FR); Grégory Michaud, Meylan (FR); Denis Martin, Clermont-Ferrand (FR); Patrick Meneroud, Meylan (FR)

(73) Assignee: Compagnie Generale des Etablissements Michelin, Clermont-Ferrand (FR)

( * ) Notice: Subject to any disclaimer, the term of this patent is extended or adjusted under 35 U.S.C. 154(b) by 25 days.

(21) Appl. No.: 14/907,186

(22) PCT Filed: Jul. 25, 2014

(86) PCT No.: PCT/EP2014/066019
§ 371 (c)(1),
(2) Date: Jan. 22, 2016

(87) PCT Pub. No.: WO2015/011260
PCT Pub. Date: Jan. 29, 2015

(65) Prior Publication Data
US 2016/0161243 A1    Jun. 9, 2016

(30) Foreign Application Priority Data
Jul. 26, 2013   (FR) ..................................... 13 57411

(51) Int. Cl.
*G01B 7/26* (2006.01)
*G01M 17/02* (2006.01)
(Continued)

(52) U.S. Cl.
CPC ............... *G01B 7/26* (2013.01); *G01M 17/02* (2013.01); *G01B 7/06* (2013.01); *G01B 7/14* (2013.01); *G01N 27/82* (2013.01); *G01R 33/12* (2013.01)

(58) Field of Classification Search
None
See application file for complete search history.

(56) References Cited

U.S. PATENT DOCUMENTS 2,228,293 A * 1/1941 Wurzbach .............. G01V 3/105
                                                         307/125
3,535,625 A * 10/1970 Pratt ....................... G01L 1/127
                                                         324/233
(Continued)

FOREIGN PATENT DOCUMENTS

DE       100 00 730 A1     7/2001
EP       1 314 580 A1      5/2003
(Continued)

OTHER PUBLICATIONS

Sep. 30, 2014 International Search Report in International Patent Appln. No. PCT/EP2014/066019.

*Primary Examiner* — Jill E Culler
(74) *Attorney, Agent, or Firm* — Venable LLP

(57) ABSTRACT

A system is provided for measuring a thickness of rubber layer of a tire. The layer includes a joined face, which is joined to an adjacent metal reinforcement, and a free face in contact with air. The system includes a casing with an application face for contacting the free face, and a sensor positioned in the casing and structured to measure a distance d between the joined face and the free face. The sensor includes a source coil and an adjacent sensing element. The source coil is a source of an alternating magnetic field. The sensing element includes a sensing device configured to produce an output signal that is dependent on an induced (Continued)

local magnetic field. An excitation power and a frequency of the source coil are such that the local magnetic field induced between the reinforcement and the source coil increases in strength as the distance d decreases.

20 Claims, 4 Drawing Sheets

(51) Int. Cl.
*G01B 7/14* (2006.01)
*G01N 27/82* (2006.01)
*G01B 7/06* (2006.01)
*G01R 33/12* (2006.01)

(56) References Cited

U.S. PATENT DOCUMENTS

| | | | | |
|---|---|---|---|---|
| 3,611,120 A * | 10/1971 | Forster | | G01N 27/9033 |
| | | | | 324/225 |
| 3,922,599 A * | 11/1975 | Steingroever | | G01B 7/105 |
| | | | | 324/230 |
| 4,096,437 A * | 6/1978 | Kitzinger | | G01N 27/82 |
| | | | | 324/227 |
| 4,387,339 A * | 6/1983 | Akerblom | | G01B 7/14 |
| | | | | 324/207.18 |
| 4,652,820 A | 3/1987 | Maresca | | 324/207 |
| 4,752,739 A | 6/1988 | Wang | | 324/230 |
| 4,804,912 A | 2/1989 | Lysén | | 324/207 |
| 4,829,251 A * | 5/1989 | Fischer | | G01B 7/105 |
| | | | | 324/230 |
| 4,847,556 A | 7/1989 | Langley | | 324/207 |
| 5,394,290 A * | 2/1995 | Ushiyama | | F16F 15/02 |
| | | | | 324/207.12 |
| 5,467,014 A | 11/1995 | Nix | | 324/230 |
| 5,682,097 A * | 10/1997 | Bryant | | G01B 7/02 |
| | | | | 324/207.16 |
| 5,886,522 A * | 3/1999 | May | | G01B 7/105 |
| | | | | 324/227 |
| 5,942,893 A | 8/1999 | Terpay | | 324/208.18 |
| 6,104,593 A | 8/2000 | Kawase et al. | | |
| 6,456,069 B1 * | 9/2002 | Scarzello | | G01R 33/045 |
| | | | | 324/202 |
| 7,001,242 B2 * | 2/2006 | Birang | | B24B 37/013 |
| | | | | 451/11 |
| 7,112,960 B2 * | 9/2006 | Miller | | B24B 37/013 |
| | | | | 324/230 |
| 8,240,198 B2 * | 8/2012 | Schade | | G01B 7/26 |
| | | | | 73/146 |
| 9,329,244 B2 * | 5/2016 | Maier | | G01R 33/028 |
| 2002/0088527 A1 * | 7/2002 | Tanaka | | G01B 17/02 |
| | | | | 156/95 |
| 2002/0157746 A1 * | 10/2002 | Merino-Lopez | | B60C 11/00 |
| | | | | 152/209.5 |
| 2003/0062891 A1 | 4/2003 | Slates | | 324/207.26 |
| 2009/0000370 A1 | 1/2009 | Lionetti et al. | | 73/146 |
| 2009/0078347 A1 | 3/2009 | Niklas et al. | | 152/154.2 |
| 2009/0102467 A1 | 4/2009 | Snell et al. | | 324/207.25 |
| 2010/0276044 A1 | 11/2010 | Heise et al. | | 152/154.2 |
| 2012/0276661 A1 | 11/2012 | Iravani et al. | | 438/10 |
| 2013/0311130 A1 | 11/2013 | Horton et al. | | 702/142 |
| 2014/0232389 A1 | 8/2014 | Maier et al. | | |
| 2016/0153763 A1 | 6/2016 | Ledoux et al. | | |
| 2016/0169657 A1 | 6/2016 | Ledoux et al. | | |

FOREIGN PATENT DOCUMENTS

| | | |
|---|---|---|
| JP | S 61-102504 A | 5/1986 |
| JP | H 07-280504 A | 10/1995 |
| JP | 2001-356002 A | 12/2001 |
| JP | 2005-315732 A | 11/2005 |
| WO | WO 2008/059283 A1 | 5/2008 |
| WO | WO 2012/148826 A2 | 11/2012 |

* cited by examiner (a)      (b)

SYSTEM FOR DETERMINING THE THICKNESS OF A RUBBER LAYER OF A TIRE

TECHNICAL FIELD

The present invention relates to a system for measuring the thickness of a layer of rubber, and more particularly to the measurement of the thickness of remaining rubber on a tread of a tire.

PRIOR ART

In a known way, the tread of a pneumatic tire, or more simply a tire, regardless of whether it is to be fitted on a passenger vehicle, a heavy transport vehicle, a civil engineering vehicle, or other vehicle, is provided with a tread pattern comprising, notably, pattern elements or elementary blocks delimited by various main, longitudinal, transverse or even oblique grooves, the elementary blocks also possibly comprising various finer slits or sipes. The grooves form channels intended to discharge the water during running on wet ground, and define the leading edges of the pattern elements.

When a tire is new, the depth of the tread is at a maximum. This initial depth may vary according to the type of tire in question, as well as the use for which it is intended; by way of example, "winter" tires generally have a pattern depth greater than that of "summer" tires. When the tire becomes worn, the depth of the elementary blocks of the pattern decreases and the stiffness of these elementary blocks increases. The increase in the stiffness of the elementary pattern blocks causes a reduction in some performance characteristics of the tire, such as the grip on wet ground. The water discharge capacity also decreases markedly when the depth of the channels in the patterns decreases.

It is therefore desirable to be able to monitor the development of the wear of the tread of a tire.

This monitoring is usually carried out by visual observation of the tread by the user or a mechanic, with or without actual measurement with a depth gauge. However, this observation is not very easy to carry out, notably on rear tires which are harder to access, and furthermore it is not very precise.

Numerous proposals to automate the measurement of the depth of tire tread patterns have been made. Such devices can be placed on the roadway on which vehicles run. These devices usually operate by two techniques, either based on optical systems with cameras or lasers, or based on eddy currents.

The systems based on optical systems are costly, have to be embedded in the roadway, and require regular maintenance. Moreover, the measurements are subject to interference due to soiling and the presence or spraying of water, mud, snow, etc.

Documents U.S. Pat. No. 7,578,180 B2 and WO 2008/059283 propose systems for measuring the thickness of the tread of a tire, comprising sensors sensitive to the eddy currents generated by an exciting magnetic field in the crown reinforcement of the tire. These systems are placed on a roadway.

However, these measurement systems are not entirely satisfactory because they are sensitive to the electric conductivity of the crown of the tires which itself varies from one tire to another and also according to the degree of tire wear. The measurements are found to be insufficiently precise and insufficiently sensitive.

BRIEF DESCRIPTION OF THE INVENTION

One subject of the invention is a system for measuring the thickness of a layer of rubber material of a tire, the layer comprising a face joined to an adjacent reinforcement made with at least one material having a magnetic permeability greater than the magnetic permeability of air, and a free face in contact with the air, and the system comprising a casing with an application face intended to be in contact with the free face of the layer and a sensor placed in the casing and capable of measuring the distance d between the joined face and the free face of the layer of rubber material. This system is characterized in that, with the sensor comprising a source of alternating magnetic field and an adjacent sensitive element, the source is a coil and the sensitive element is a sensor the output signal of which is dependent on the magnitude of the local induced magnetic field, and in that the excitation power and frequency of the source coil are such that the magnetic field induced between the adjacent reinforcement and the source coil increases in strength as the distance d decreases.

According to one subject of the invention, the sensor of the measurement system has the advantage of operating in reluctance mode, and therefore with a lower coil excitation frequency for a given power than in the case of a similar sensor operating in a mode sensitive to eddy currents. It should be noted that in the case of the usual tire crown reinforcements, made up of metal reinforcers embedded in a rubber material with barely any conductivity, no eddy currents or only weak eddy currents are detected under these operating conditions.

Measurement in reluctance mode also makes use of the magnetic permeability of the adjacent reinforcement, and has been found to provide high measurement sensitivity to any variation in the distance d.

For preference, the sensitive element is a sensor chosen from the group consisting of Hall-effect sensors and magnetoresistive sensors.

Hall-effect sensors use a property of semiconductors which, when a current is passing through them and a magnetic field is applied to them perpendicular to the direction in which the said current is passing, develop a voltage proportional to the applied magnetic field and that can be measured in the direction of this field. Measuring this voltage then makes it possible to estimate the intensity of the magnetic field in which the semiconductor is immersed.

Magnetoresistive sensors use the property that semiconductors have whereby they exhibit a resistance that changes as they are subjected to a magnetic field. By subjecting such a material to a known electric current and by measuring the voltage at the terminals of this material, it then becomes possible to estimate the strength of the magnetic field in which the magnetoresistive material is immersed.

According to one preferred embodiment, the sensitive element is positioned between the source coil and the application face of the casing.

In this embodiment, the induced magnetic field measured by the sensitive element increases in strength as the distance d decreases.

In another embodiment, the source coil is positioned between the sensitive element and the application face.

In this embodiment, the induced magnetic field measured by the sensitive element decreases in strength as the distance d decreases.

The sensitive element and the source coil may also be positioned adjacent and substantially the same distance from the application face of the casing.

In this embodiment, the induced magnetic field measured by the sensitive element decreases in strength also as the distance d decreases.

According to one advantageous embodiment, the source coil is positioned around, or is surrounded by, a material having high electrical resistivity and high magnetic permeability.

The presence of this material having high electrical resistivity and high magnetic permeability, such as a ferrite, has the advantage of localizing the magnetic field lines and thus providing a more localized measurement of layer thickness.

For preference, for all the embodiments with a material having high electrical resistivity and high magnetic permeability, the sensor of the sensitive element is positioned at the end of one of the branches of the material having high electrical resistivity and high magnetic permeability.

The ferrite may be of varied form, notably in the shape of a U. In this case, the excitation coil or source coil is then preferably positioned around one of the lateral branches of the U.

Alternatively, the source coil may be positioned around the bottom of the U of the ferrite.

In this embodiment, the range of the sensor can be improved simply by increasing the spacing between the two ends of the U.

This range may also be increased by increasing the cross section of the poles formed by the two parallel bars of the U-shaped ferrite.

According to another embodiment, the source coil is positioned around an E-shaped material having high electrical resistivity and high magnetic permeability.

In this embodiment, the source coil is advantageously positioned around the central bar of the E.

In this embodiment, the range of the sensor can be improved simply by increasing the spacing between the central bar of the E and its two outer bars.

This range may also be increased by increasing the cross section of the poles formed by the three parallel bars of the E-shaped ferrite.

In this embodiment using an E-shaped ferrite, it is also possible to position a sensitive element at the end of each outer pole facing the adjacent reinforcement. In this way, measurements can be taken at two points, using just one single source of magnetic field.

According to a third embodiment, the source coil is positioned around a material having high electrical resistivity and high magnetic permeability, the material having an axis of symmetry and being E-shaped as seen in any axial section.

In this so-called "potted" embodiment, the source coil is advantageously positioned around the central axis of the material having high electrical resistivity and high magnetic permeability and the sensitive element is positioned at the end of the central axis of the pot.

In this embodiment, the range of the sensor can be improved simply by increasing the outside diameter of the pot structure, so that the spacing between the central pole and the outer pole becomes greater.

This range may also be increased by increasing the cross section of the two poles of the pot structure.

This axisymmetric embodiment has the advantage of being insensitive to the orientation of the metal cords forming the adjacent reinforcement. The sensor is therefore insensitive to the anisotropy of this adjacent layer.

According to some highly preferred embodiments, use may be made of several sensitive elements adjacent to the source coil, connected together so that the difference in induced magnetic field picked up by the combination of the various sensitive elements is low or zero in the absence of an adjacent reinforcement, and non-zero when there is an adjacent reinforcement present.

This embodiment has the advantage of improving the sensitivity of the sensor, of simplifying the control electronics and associated measurement electronics and of reducing the costs thereof.

According to one particular embodiment, the material having high electrical resistivity and high magnetic permeability is H-shaped.

For preference, the H is positioned in the casing with the lateral branches normal to the application face of the casing.

As before, the range of the sensor can be increased by increasing the spacing between the two lateral bars of the H or by increasing the cross section of the poles formed by these two lateral bars.

Then source may then be a coil positioned around the central bar of the H.

The source may also comprise two coils each one positioned around a lateral branch of the H, preferably one on each side of the central branch of the H.

The source may also comprise four coils each one positioned around half a lateral branch of the H.

In this particular case of an H-shaped ferrite, the sensor of the sensitive element may comprise two sensors each one positioned at one end of one and the same lateral branch of the H. The sensor of the sensitive element may also comprise two sensors each one positioned on a distinct lateral branch of the H, one on each side of the central branch. It is also possible to use four sensors each one positioned at one end of each lateral half branch of the H.

In the absence of an adjacent layer, i.e. under free conditions, the local induced magnetic field measured on the one hand, by the sensor or sensors positioned at the top ends of the H is equal to the local induced magnetic field measured, on the other hand, by the sensor or sensors positioned at the bottom ends of the poles of the H. The difference in output signal between these sensors is therefore small or zero.

By advantageously connecting these various sensors of the sensitive element to one another, the device can therefore operate in differential mode, with a low or zero common mode. This offers the advantage of improving the sensitivity of the measurement, of simplifying the control electronics and associated measurement electronics and of reducing the costs thereof.

In the case of measurements taken on a tire tread, the two branches of the H (or poles) are preferably placed in the direction of running and with each branch positioned vertically, and the measurement is therefore a mean measurement of the distance between the sensor and the reinforcement of the adjacent layer, which distance is associated with the distance between the two branches of the H.

In all the embodiments, the source may comprise one or more coils.

The source coil is supplied by an alternating electric source, advantageously with a frequency lower than 500 kHz and this then very greatly limits the generation of eddy currents in the adjacent reinforcement of the layer. Additionally, if a frequency of 10 kHz is exceeded, the conventional noise measured by an antenna in the near field is avoided.

Furthermore, as the supply frequency increases for a given current, the time resolution of the measurement improves.

Additionally, increasing the frequency makes it possible to reduce the measurement time, which has a favourable effect on the power consumption of the whole system.

It has been found to be advantageous to use a supply frequency in the range from 40 to 150 kHz.

These limits on the frequency make it possible to limit the eddy currents likely to arise in the metal reinforcers of the tire reinforcement.

For preference, the measurement system comprises a device for measuring the amplitude of the signal at the terminals of the sensor or sensors of the sensitive element.

To do this, the source coil can be supplied with a known stationary sinusoidal current, making it possible repeatedly to fix the induced magnetic field that can be measured in the vicinity of the sensor, and a device for measuring the amplitude of the voltage at the terminals of the sensor or sensors constituting the sensitive element can be used.

This device for measuring the amplitude of the voltage at the terminals of the sensitive element may measure the voltage continuously or may use an amplitude demodulation system.

The measurement system is advantageously positioned in an electrically non-conductive casing whose materials have a magnetic susceptibility equal to zero or sufficiently low to be similar to those of air or a vacuum.

Preferably, with the source coil having an axis of sensitivity and the casing having a face for application against the free face of the layer whose thickness is to be measured, the application face of the casing is normal or parallel to the axis of sensitivity of the source coil according to the embodiment.

The casing may be a portable casing.

In this case, the measurement system according to one subject of the invention may be used for measuring the thickness of rubber material of a sidewall or inner liner of a tire. This measurement can be performed during the manufacture of the tire or after the completion of this operation.

The casing may also be suitable for positioning on, or embedding in, a roadway.

In this case, the measurement system is preferably used for measuring the thickness of remaining rubber material on a tire tread.

Evidently, each source coil of the measurement system according to one subject of the invention may be formed by a plurality of coils connected in series or in parallel.

For preference, when the coils used are flat coils, each of the source coils may be produced in the form of conductive tracks wound in the form of spirals on a PCB or plastronic support.

A plastronic support refers to a technology that allows conductive tracks to be printed and electronic components to be fixed directly on injection-moulded plastic components.

The invention is particularly applicable to tires having metal reinforcers in their crowns and/or their carcass plies, such as those to be fitted on motor vehicles of the passenger or SUV ("Sport Utility Vehicle") type, or on industrial vehicles selected from among vans, heavy transport vehicles—i.e. light rail vehicles, buses, heavy road transport vehicles (lorries, tractors and trailers), and off-road vehicles such as civil engineering vehicles—and other transport or handling vehicles.

DESCRIPTION OF THE DRAWINGS

The attached figures show a number of embodiments of a measurement system according to one subject of the invention, taking as the principal example the application of the invention to the measurement of the thickness of tire treads.

DETAILED DESCRIPTION OF THE INVENTION

Figure 1:
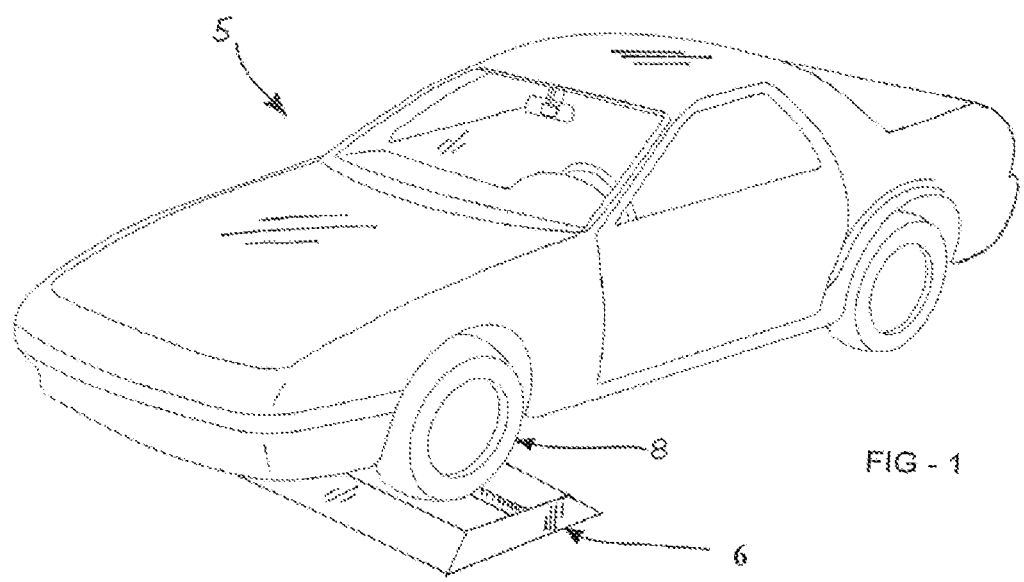
FIG. 1 is a perspective view of a vehicle, a tire of which is passing over a casing comprising a measurement system according to one subject of the invention.

FIG. 1 shows a vehicle 5 whose tire 8 is running over a casing 6 comprising a wear measurement system. The figure shows a passenger vehicle, but such a measurement system can also be used for any other vehicle, such as a heavy transport vehicle or a coach. The remaining thickness of rubber material on the tread of the tire 8 is measured when the tire runs over the casing 6, without any need to stop the vehicle or remove the tire from the vehicle.

Figure 2:
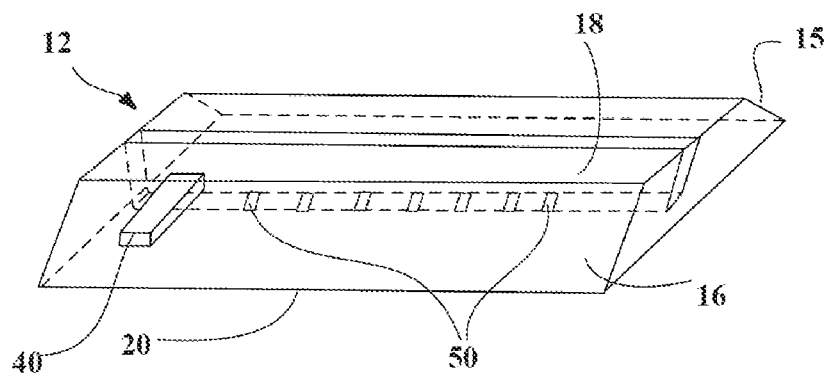
FIG. 2 shows a casing with a measurement system.

FIG. 2 shows a casing 12 according to one of the subjects of the invention. This casing takes the form of a portable assembly which can be placed on a roadway. It has a substantially trapezoidal cross section. The casing comprises two inclined portions, namely an access ramp 15 and an exit ramp 16. Between these two portions there is a substantially horizontal portion 18. The portion 18 of the casing 12 protects a sensor or a row of sensors 50 for making the distance measurements. The base 20 of the casing is placed against the roadway and gives the casing the necessary stability during the operation of the system. The casing 12 also comprises electronic circuitry 40 with a power source which supplies the sensors 50 with alternating current. The measurements are made when the tire contact patch is resting on the horizontal portion 18. This horizontal portion is the face of the casing which is applied to the surface of the tire tread. The casing 12 is made of a non-conductive material the magnetic properties of which can be linked to those of air, to avoid interference with the measurements.

According to other embodiments, the casing may be embedded in a roadway or may have suitable dimensions and weight for application against a sidewall or an inner liner of a tire.

Figure 3:
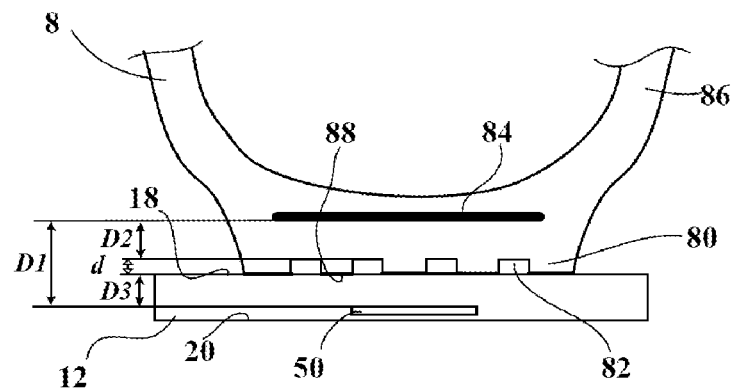
FIG. 3 shows a cross section of a tire in contact with the casing of the measurement system.

The measurement of the thickness of rubber material remaining on a tire tread is illustrated in FIG. 3. This figure shows a partial cross section of a tire 8 bearing on the application face 18 of a casing 12. The tire 8 comprises, notably, a tread 80 with patterns 82, a crown reinforcement 84 consisting of two or more plies of metal reinforcers (not shown), and sidewalls 86. The casing 12 comprises an application face 18, a base 20 and a row of sensors 50. The running surface 88 of the tread 80 bears against the application face 18 of the casing 12.

The sensors 50 measure, as will be explained below, the distance D1 which separates them from the metal reinforcement 84 of the crown of the tire 8. D1 has three components. Two of these components are fixed, namely the distance D2 which separates the bases of the patterns 82 from the reinforcement 84, and the distance D3 which separates the sensors 50 from the application face 18 of the casing 12. One component is variable with the degree of wear of the tread, namely d, which corresponds to the remaining thickness of the tread. Thus:

$$d=D1-D2-D3$$

The distance D2 can be known on the basis of the identification of the type of tire being measured. This identification may be manual or automatic, being performed, for example, by retrieving identification data recorded in a transponder such as an RFID device incorporated in the tire structure.

Figure 4:
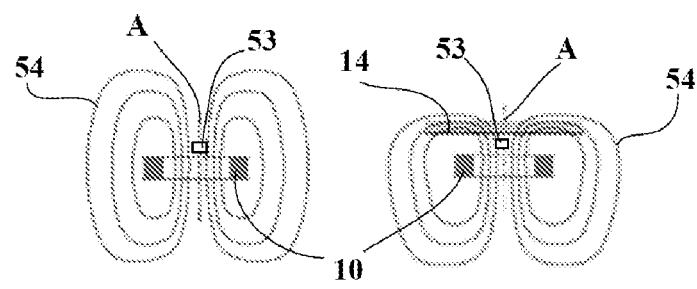
FIG. 4 shows the operating principle of a measurement system in the case of an air-cored coil, in the absence (a) and in the presence (b) of a metal plate.

FIG. 4 shows the operating principle of the sensor of a measurement system according to one subject of the invention.

FIG. 4(a) depicts an air-cored coil 10 with an axis of symmetry and of sensitivity A. When the terminals of the coil are supplied with an alternating current, the magnetic field lines 54 emitted by this device extend through the air all around the coil as indicated schematically in FIG. 4(a).

If a metal reinforcement 14, which is a good magnetic field conductor and a poor electrical conductor, such as a crown ply of a tire consisting of parallel metal reinforcers embedded in two layers of low-conductivity rubber material, is brought towards this device, the field lines will naturally attempt to pass through this metal reinforcement rather than through the air, because the reluctance of air is greater than that of the metal reinforcement. A localization of the magnetic field lines 54 through the metal reinforcement 14 can be observed.

The result is that the magnetic field induced in the area located between the coil 10 and the metal reinforcement will increase in strength.

Thus the variation of the position of the metal reinforcement 14 relative to the coil 10 can be measured by measuring the local field induced between the coil 10 and the metal reinforcement 14. This can be done using a sensor sensitive to the local induced magnetic field 53, such as a Hall-effect sensor or a magnetoresistive sensor.

Figure 5:
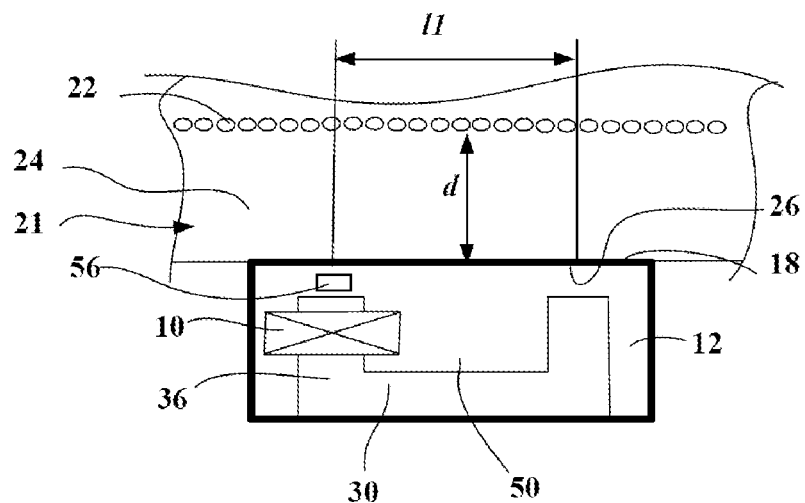
FIG. 5 shows schematically an example of the operation of the measurement system in the case of an excitation coil with a U-shaped ferrite.

FIG. 5 shows a schematic example of the operation of an embodiment of a measurement system in the case of an excitation coil and a U-shaped ferrite.

The layer 21 whose thickness d is to be measured comprises a layer of rubber material 24 adjacent to a reinforcement 22 formed by reinforcers whose magnetic permeability is greater than the magnetic permeability of air, such as those normally used for carcass plies or crown plies of tires, notably those of heavy transport vehicles.

The casing 12 of the measurement system comprises a sensor 50 which comprises an excitation coil 10 positioned around one of the lateral branches 36 of a U-shaped ferrite 30, and a Hall-effect sensor 56. The sensor 56 is placed at the end of the lateral branch 36 of the ferrite 30. The presence of the ferrite 30 allows the circulation of the magnetic field lines to be localized within it thereby localizing the measurement zone. The two bars of the U are spaced apart by a distance 11.

The casing 12 has its application face 18 bearing against the free face 26 of the layer 21.

According to an essential characteristic of the measurement system, the excitation frequency and power of the excitation coil 10 are such that the magnetic field induced between the ends of the poles of the ferrite 30 and the adjacent reinforcement 22 increases in strength as the distance d decreases.

Thus the operating mode of the sensor is a reluctance mode, and is therefore related to the magnetic permeability of the different parts of the magnetic circuit.

The magnetic permeability of the rubber material is much lower than that of the adjacent reinforcement, which is itself lower than that of the ferrite.

Consequently, the reluctance of the layer 24 of rubber material is much higher than that of the adjacent reinforcement 22, which is itself higher than that of the ferrite 30. This means that the variation in induced magnetic field measured at the ends of the ferrite 30 is mainly due to the variation in the distance d which is the thickness of the layer of rubber material, since any variation in the reluctance of the adjacent reinforcement caused, for example, by the number of reinforcers or their construction has only a minor effect on the accuracy of the measurement. The accuracy and sensitivity of such a sensor in reluctance mode are therefore good. The range of the sensor is dependent on the distance 11, which is the distance between the two bars of the U, and on the cross section of the poles formed by these two parallel bars.

FIGS. 6 to 9 show alternative embodiments of sensors.

Figures 6, 7:
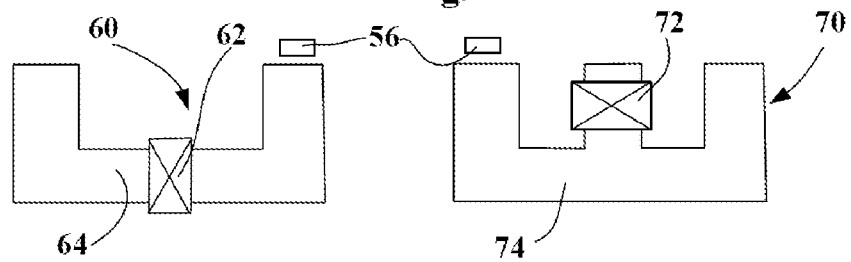
FIG. 6 shows an alternative embodiment of the system of FIG. 5.
FIG. 7 shows a second embodiment with an E-shaped ferrite.

In FIG. 6, the sensor 60 comprises a U-shaped ferrite 64, an excitation coil 62 positioned around the central bar of the U and a Hall-effect sensor 56 placed at the end of one of the lateral branches of the U.

In FIG. 7, the sensor 70 comprises an E-shaped ferrite 74, a coil 72 positioned around the central bar of the E, and a Hall-effect sensor 56 placed at the end of one of the lateral branches of the E.

Figure 8:
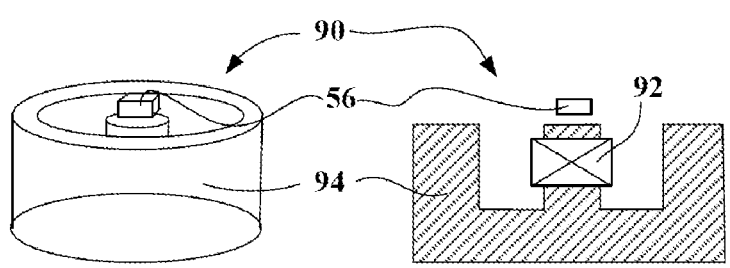
FIG. 8 shows a third embodiment with a pot-shaped ferrite.

In FIG. 8, the sensor 90 comprises a pot-shaped ferrite 94 with an axis of symmetry and a central bar positioned substantially along this axis of symmetry, and an excitation coil 92 positioned around the central bar of the pot. It also comprises a Hall-effect sensor 56 positioned near the end of the central bar of the ferrite 94. FIG. 8(a) shows a perspective view of the sensor, and FIG. 8(b) shows a cross section along the axis of symmetry.

This pot structure has the advantage of being insensitive to the anisotropy of the metallic architecture inside the tire. This is true because the Hall-effect sensor is positioned at the end of the central bar of the pot and because viewed in any axial section, the measurement system is axisymmetric.

Figure 9:
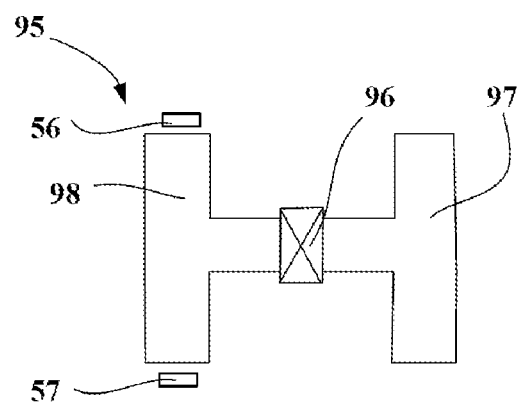
FIG. 9 shows an embodiment with an H-shaped ferrite.

FIG. 9 shows another embodiment of a sensor 95. This sensor comprises an excitation coil 96 positioned around the central bar of an H-shaped ferrite 97. It also comprises two Hall-effect sensors 56 and 57 each one positioned at one end of the lateral bar 98 of the ferrite 97. In free conditions, the two sensors have the same measurement signal. The difference between the two signals is therefore zero under such conditions. That means that the common mode can be completely or nearly completely cancelled, thereby improving the sensitivity of the sensor. The distance to be measured is therefore linked to this difference by a non-linear law.

Figure 10:
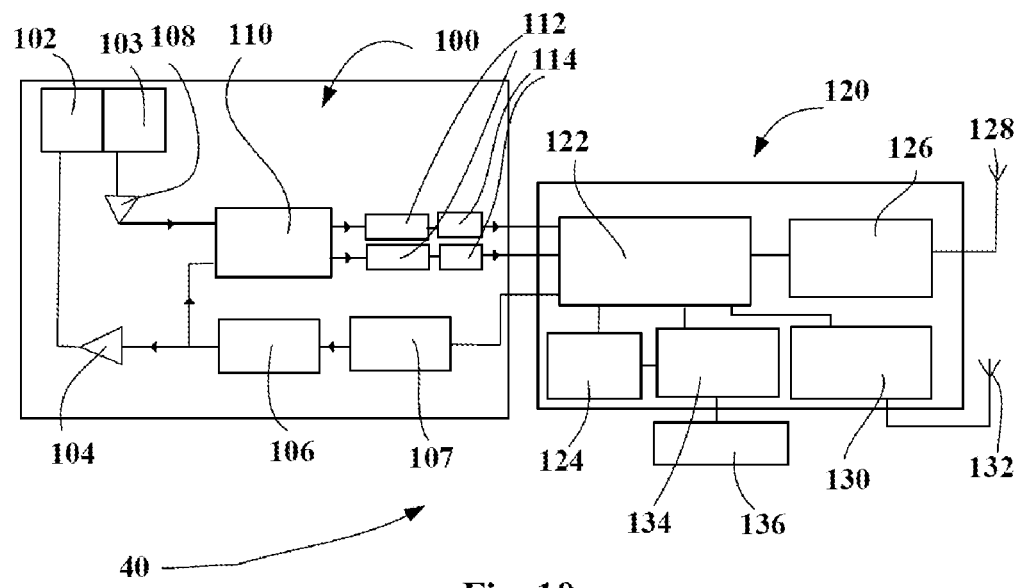
FIG. 10 shows schematically a structure of the electronic circuitry of a measurement system.

FIG. 10 shows an example of the structure of the electronic circuitry that allows the thickness of a layer of rubber of a tire to be measured in the case of a sensor consisting of a source coil 102 and of a sensitive element 103 made up of a single sensor that measures the local induced magnetic field, or several sensors connected together.

This electronic circuitry is formed by a "sensor module" 100 and a "motherboard" 120. It can therefore be used to measure the thickness of a layer at a single point.

In order to extend the principle of this arrangement to a system consisting of multiple sensors, it is simply necessary to use a plurality of "sensor modules", all connected to the same "motherboard".

In reluctance mode, the induced magnetic field measured by the sensitive element 103, positioned between the reinforcement of an adjacent layer and the source coil, increases as the distance d between the sensor and the adjacent reinforcement, consisting of metal tire cords, decreases. The purpose of this electronic circuitry is therefore to measure the magnitude of this voltage U, at the terminals of the sensitive element, so as to be able to deduce this distance between the sensor and the reinforcement of the adjacent layer.

In addition to comprising the source coil 102 and the sensitive element 103, the "sensor module" 100 consists, inter alia, of a current amplifier 104 driven by an oscillator 106 the frequency of which is imposed by a time base 107. The amplifier, oscillator and time base form part of the "sensor module". The current generated by the amplifier 104 and injected into the source coil 102 is taken as phase reference ($\phi=0$).

The voltage U of phase $\phi$, which is non-zero relative to the current I, collected at the terminals of the sensitive element 103, is first amplified by the amplifier 108 and then injected into a double demodulator 110, together with the output signal of the oscillator 106.

At the output of the demodulator 110, the signals X and Y are found, representing the two complex components describing the voltage at the terminals of the sensitive element, such that:

$$U=K\sqrt{X^2+Y^2}$$

where K is a factor dependent on the amplification present along the electronic circuit.

The two signals X and Y are then filtered by the filters 112 and digitized by means of analogue/digital converters (ADC) 114, and are then injected into the microcontroller 122 of the "motherboard" 120.

From X and Y the microcontroller 122 deduces the magnitude of the voltage U at the terminals of the sensitive element 103, by using the formula above.

The motherboard is also provided with a number of additional functional units, namely:
 a memory 124 to allow the measurements taken by the sensor consisting of the source coil 102 and of the sensitive element 103 to be recorded;
 an RFID decoder 126 for identifying the tire, by means of an antenna 128, if this can be done by using the presence of an RFID device incorporated in the tire structure;
 a wireless communication module 130 for sending data over a distance, via a supplementary antenna 132; and
 a power supply 134 distributing the current required for the whole system from a battery 136.

The assembly is able to perform numerous measurements on tires without a battery change, giving the system several years of service life without human intervention.

The invention claimed is:

1. A measurement system for determining a thickness of a layer of rubber material of a tire, the layer of rubber material including (i) a joined face, which is joined to a reinforcement formed of at least one material having a magnetic permeability greater than a magnetic permeability of air, and (ii) a free face in contact with air, the system comprising:
 a casing structured to include an application face for contacting the free face of the layer of rubber material; and
 a sensor positioned in the casing and arranged to measure a distance D1 between the joined face and a portion of the sensor, the sensor including: (a) a source coil element, which is a source of an alternating magnetic field, and (b) a sensing element structured to operate in a reluctance mode to produce an output signal that is dependent on a magnitude of a local magnetic field induced between the reinforcement and the source coil element,
 wherein an excitation power and a frequency of the source coil element are such that the local magnetic field induced between the reinforcement and the source coil element increases in strength as the distance D1 decreases,
 wherein the distance D1 is used to determine the thickness of the layer of rubber material, and
 wherein the sensor further includes a U-shaped structure, the sensing element is arranged on an arm of the U-shaped structure, the source coil element is also arranged on the arm of the U-shaped structure, and the source coil element is located farther from the application face than the sensing element.

2. The measurement system according to claim 1, wherein the sensing element is a Hall-effect sensor or a magnetoresistive sensor.

3. The measurement system according to claim 2, wherein the source coil element is supplied with an alternating electrical current or a voltage having a frequency in a range from 40 kHz to 80 kHz.

4. The measurement system according to claim 1, wherein the sensing element is positioned between the source coil element and the application face of the casing along a vertical line between the source coil element and the application face.

5. The measurement system according to claim 1, wherein the structure includes ferrite, and
 wherein the source coil element is positioned around, or is surrounded by, the ferrite.

6. The measurement system according to claim 5, wherein the sensing element is positioned at an end of a branch of the structure.

7. The measurement system according to claim 1, wherein the source coil element is supplied with an alternating electrical current or a voltage having a frequency below 500 kHz.

8. The measurement system according to claim 7, wherein the source coil element is supplied with an alternating electrical current or a voltage having a frequency higher than 10 kHz.

9. The measurement system according to claim 1, wherein the source coil element is supplied with an alternating electrical current or a voltage having a frequency in a range from 40 kHz to 80 kHz.

10. The measurement system according to claim 1, wherein the casing is electrically non-conductive and has magnetic properties similar to those of air, and
 wherein the application face of the casing is parallel or normal to an axis of sensitivity of the source coil element.

11. The measurement system according to claim 1, wherein the casing is a portable casing.

12. The measurement system according to claim 1, wherein the casing is structured to be positioned on or embedded in a roadway.

13. The measurement system according to claim 1, further comprising electronic circuitry that determines the thickness of the layer of rubber material based on the distance D1 and a predetermined distance D3 between the portion of the sensor and the application face.

14. The measurement system according to claim 13, wherein the electronic circuitry determines a thickness d of a sublayer located within the layer of rubber material and sharing the free face of the layer of rubber material based in part on the thickness of the layer of rubber material.

15. A measurement system for determining a thickness of a layer of rubber material of a tire, the layer of rubber material including (i) a joined face, which is joined to a reinforcement formed of at least one material having a magnetic permeability greater than a magnetic permeability of air, and (ii) a free face in contact with air, the system comprising:
- a casing structured to include an application face for contacting the free face of the layer of rubber material; and
- a sensor positioned in the casing and arranged to measure using reluctance a distance D1 between the joined face and a portion of the sensor, the sensor including: (a) a source coil element, which is a source of an alternating magnetic field, and (b) a sensing element structured to operate in a reluctance mode to produce an output signal that is dependent on a magnitude of a local magnetic field induced between the reinforcement and the source coil element,
- wherein the casing is made of a non-conductive material having magnetic properties of air,
- wherein the application face of the casing is parallel or normal to an axis of sensitivity of the source coil element,
- wherein an excitation power and a frequency of the source coil element are such that the local magnetic field induced between the reinforcement and the source coil element increases in strength as the distance D1 decreases,
- wherein the distance D1 is used to determine the thickness of the layer of rubber material,
- wherein the sensor further includes a U-shaped structure comprising ferrite,
- wherein the sensing element comprises a Hall-effect sensor and is arranged between (i) an end of a first arm of the U-shaped structure that faces the application face and (ii) the application face,
- wherein the source coil element is arranged on a part of the U-shaped structure that connects (i) the first arm of the U-shaped structure and (ii) a second arm of the U-shaped structure,
- wherein the source coil element is located farther from the application face than the sensing element,
- wherein the source coil element is supplied with an alternating electrical current or a voltage having a frequency in a range from 40 kHz to 80 kHz so as to reduce eddy current generation, and
- wherein the ferrite has a magnetic permeability which is greater than the magnetic permeability of the reinforcement, and has a reluctance which is less than a reluctance of the reinforcement.

16. A measurement system for determining a thickness of a layer of rubber material of a tire, the layer of rubber material including (i) a joined face, which is joined to a reinforcement formed of at least one material having a magnetic permeability greater than a magnetic permeability of air, and (ii) a free face in contact with air, the system comprising:
- a casing structured to include an application face for contacting the free face of the layer of rubber material; and
- a sensor positioned in the casing and arranged to measure a distance D1 between the joined face and a portion of the sensor, the sensor including: (a) a plurality of source coil elements, each of which is a source of an alternating magnetic field, and (b) a plurality of sensing elements, each of which is structured to operate in a reluctance mode to produce an output signal that is dependent on a magnitude of a local magnetic field induced between the reinforcement and the source coil element,
- wherein an excitation power and a frequency of each source coil element are such that the local magnetic field induced between the reinforcement and the source coil element increases in strength as the distance D1 decreases,
- wherein the distance D1 is used to determine the thickness of the layer of rubber material,
- wherein the sensor further includes an H-shaped structure,
- wherein two of the plurality of sensing elements are disposed at opposite sides of a first lateral arm of the H-shaped structure, and two of the plurality of source coil elements are also provided on the first lateral arm,
- wherein two more of the plurality of sensing elements are disposed on opposite sides of a second lateral arm of the H-shaped structure, and two more of the plurality of source coil elements are also provided on the second lateral arm,
- wherein each source coil element is supplied with an alternating electrical current or a voltage having a frequency in a range from 40 kHz to 80 kHz, and
- wherein each of the plurality of sensing elements provides a separate output signal and the distance D1 is measured in accordance with (a) a difference between the separate output signal of a first sensing element of the plurality of sensing elements and the separate output signal of a second sensing element of the plurality of sensing elements and (b) a non-linear relationship.

17. The measurement system according to claim 16, wherein each of the plurality of sensing elements is a Hall-effect sensor, and
- wherein a difference between a signal from a Hall-effect sensor of one of the plurality of the sensing elements and a Hall-effect sensor of another of the plurality of sensing elements is used when measuring the distance D1.

18. The measurement system according to claim 17, wherein the sensor is one of a plurality of such sensors provided in a row in the measurement system, and
- wherein the difference between a signal from a Hall-effect sensor of one of the plurality of sensing elements and a Hall-effect sensor of another of the plurality of sensing elements is used in conjunction with a non-linear relationship to measure the distance D1.

19. A measurement system for determining a thickness of a layer of rubber material of a tire, the layer of rubber material including (i) a joined face, which is joined to a reinforcement formed of at least one material having a magnetic permeability greater than a magnetic permeability of air, and (ii) a free face in contact with air, the system comprising:

a casing structured to include an application face for contacting the free face of the layer of rubber material; and a sensor positioned in the casing and arranged to measure using reluctance a distance $D1$ between the joined face and a portion of the sensor, the sensor including: (a) a source coil element, which is a source of an alternating magnetic field, and (b) a sensing element structured to operate in a reluctance mode to produce an output signal that is dependent on a magnitude of a local magnetic field induced between the reinforcement and the source coil element, wherein the casing is made of a non-conductive material having magnetic properties of air, wherein the application face of the casing is parallel or normal to an axis of sensitivity of the source coil element, wherein an excitation power and a frequency of the source coil element are such that the local magnetic field induced between the reinforcement and the source coil element increases in strength as the distance $D1$ decreases, wherein the distance $D1$ is used to determine the thickness of the layer of rubber material, wherein the sensor further includes a pot-shaped structure with a central bar extending from a bottom inner surface of the pot-shaped structure toward the application face, wherein the source coil element is disposed around the central bar, wherein no sensing element is disposed around the central bar, wherein the source coil element is located farther from the application face than any sensing element, wherein the pot-shaped structure comprises ferrite, wherein the sensing element comprises a Hall-effect sensor disposed between (a) an end of the central bar that faces the application face and (b) the application face, and wherein the source coil element is supplied with an alternating electrical current or a voltage having a frequency in a range from 40 kHz to 80 kHz so as to reduce eddy current generation, and wherein the ferrite has a magnetic permeability which is greater than the magnetic permeability of the reinforcement, and has a reluctance which is less than a reluctance of the reinforcement.

20. The measurement system according to claim 19, further comprising an RFID detector configured to detect an RFID device incorporated in the tire, wherein the source coil element comprises a plurality of coils, and wherein the sensor further comprises an amplifier, a filter, and a demodulator, and the sensor obtains two signals representing two complex components describing voltage at terminals of the sensing element.

* * * * *